United States Patent [19]
Boggs et al.

[11] Patent Number: 5,972,787
[45] Date of Patent: Oct. 26, 1999

[54] CMP PROCESS USING INDICATOR AREAS TO DETERMINE ENDPOINT

[75] Inventors: Karl E. Boggs; Chenting Lin, both of Poughkeepsie; Joachim F. Nuetzel, Fishkill, all of N.Y.; Robert Ploessl, Glen Allen, Va.; Maria Ronay, Briarcliff Manor, N.Y.; Florian Schnabel, Wappingers Falls, N.Y.; Jeremy K. Stephens, Ossining, N.Y.

[73] Assignee: International Business Machines Corp., Armonk, N.Y.

[21] Appl. No.: 09/135,866

[22] Filed: Aug. 18, 1998

[51] Int. Cl.$^6$ .................. H01L 21/4763; H01L 21/302; H01L 21/31

[52] U.S. Cl. ............... 438/633; 438/692; 438/691; 438/759; 216/88; 216/84; 156/345

[58] Field of Search ............... 438/633, 692, 438/691, 759, 16, 926; 216/88, 84, 53; 156/345

[56] References Cited

U.S. PATENT DOCUMENTS

| | | | |
|---|---|---|---|
| 4,789,648 | 12/1988 | Chow et al. .......................... 437/225 |
| 4,910,155 | 3/1990 | Cote et al. . | |
| 5,234,868 | 8/1993 | Cote .......................... 437/225 |
| 5,433,651 | 7/1995 | Lustig et al. .......................... 451/6 |
| 5,552,996 | 9/1996 | Hoffman et al. .......................... 364/468.28 |
| 5,639,697 | 6/1997 | Weling et al. .......................... 437/225 |
| 5,660,672 | 8/1997 | Li et al. . | |
| 5,663,637 | 9/1997 | Li et al. . | |
| 5,663,797 | 9/1997 | Sandhu .......................... 438/16 |
| 5,672,091 | 9/1997 | Takahashi et al. .......................... 451/6 |
| 5,677,231 | 10/1997 | Maniar et al. . | |
| 5,736,462 | 4/1998 | Takahashi et al. .......................... 438/692 |
| 5,846,882 | 12/1998 | Birang .......................... 438/692 |

*Primary Examiner*—Charles Bowers
*Assistant Examiner*—Sam Lee
*Attorney, Agent, or Firm*—Scully, Scott, Murphy & Presser; Steven Capella

[57] ABSTRACT

The method of polishing metal layers on wafers comprises the steps of: providing indicator areas on said wafer, said indicator areas having combinations of line widths and pattern factors violating existing ground rules of metal lines thereby said indicator areas being dished out during said polishing using a chemical-mechanical polisher to polish the metal layers to remove material therefrom, inspecting indicator areas on the wafer to determine an amount of material removed from said areas, and adjusting the operation of the chemical-mechanical polisher in response to the inspection of the indicator areas. The indicator areas may include macroblocks comprised of a multitude of individual blocks. The wafer may be inspected by optically identifying the polishing state of to blocks in the macroblock. Additionally, the process may be automated for mass production. A feedback loop to the polisher can be formed where data from optical inspection of macroblocks on a polished wafer can be immediately fed back to the polisher in order to adjust process parameters.

7 Claims, 3 Drawing Sheets

CM P PROCESS USING INDICATOR AREAS TO DETERMINE ENDPOINT

BACKGROUND OF THE INVENTION

This invention generally relates to a method and apparatus for detecting the endpoint in chemical-mechanical polishing of semiconductor wafers; and more particularly, the invention relates to detecting the endpoints of critical areas on the wafer.

In the production of ultra-high density integrated circuits, chemical-mechanical polishing (CMP) processes are used to remove material from the surfaces of wafers. In a typical CMP process, a wafer is pressed against a polishing pad in the presence of a slurry under controlled chemical pressure, velocity, and temperature conditions. The slurry solution generally contains small abrasive particles that abrade the surface of the wafer, and chemicals that etch and/or oxidize the surface of the wafer. The polishing pad is generally a planar pad made from a continuous phase matrix material, such as polyurethane. Thus, when the pad and/or the wafer moves with respect to the other, material is removed from the surface of the wafer by the abrasive particles (mechanical removal) and by the chemical (chemical removal) in the slurry.

When a conductive layer is polished from a wafer, the CMP processes must accurately stop polishing the wafer at a desired endpoint. Conductive layers are typically deposited over insulative layers to fill vias or trenches in the insulative layer and to form electrical interconnections between device features on the wafer. To isolate electrically the interconnects from one another, it is desirable to stop the CMP process below the top of the insulative layer and above the bottom the conductive material in the vias and trenches. If the CMP process is stopped before the desired endpoint ("under-polishing"), then the interconnects will not be electrically isolated from one another and shorting will occur in the circuit. Conversely, if the CMP process is stopped after the desired endpoint ("over-polishing"), then interconnects may be completely removed from the wafer. Therefore, to avoid serious defects in a wafer, it is highly desirable to stop the CMP process at the desired endpoint.

It is particularly difficult to determine the endpoint of the CMP process on wafers that have small "critical areas." The critical areas are typically depressions on the surface of the wafer that are the last point on the wafer from which the conductive material is removed by CMP processing. The location and size of the critical area is a function of the circuit design and the uniformity of the polishing rate across the surface of the wafer. As a result, the critical areas vary from one type of die to another, and they typically occupy a minuscule portion of the wafer surface.

Metal CMP uniformity and performance (i.e. meeting the process parameter specs) can be controlled by carrying out $R_s$ (sheet resistance) measurements and measuring the yield of open/short yield macros after CMP processing. However, such techniques generally require removal of the wafer from the CMP processing area with the need to reinstall the wafer in the CMP unit in the event polishing is measured to be incomplete. Optical thickness measurements as commonly used in oxide CMP are not possible because of the reflectivity of metal films. Profiler measurements are time consuming and are highly affected by the topography under the feature to be profiled. Thus, there is a need for improved methods of judging the uniformity of polished wafers while the wafers are still in the CMP area.

SUMMARY OF THE INVENTION

An object of this invention is to provide a fast, optical way of controlling the performance of a metal CMP process, thereby giving fast feedback to the operator.

Another object of the present invention is to optically monitor color(reflectance) change of an indicator area of a wafer to determine when to stop polishing the wafer.

These and other objectives are attained with a method of polishing metal layers on wafers having indicator areas. The method comprises the steps of using a chemical-mechanical polisher to polish the metal layers to remove material therefrom, inspecting the indicator areas on the wafer to determine an amount of material removed from said areas, and adjusting the operation of the chemical-mechanical polisher in response to the inspection of the indicator areas.

For example, these indicator areas may include macroblocks comprised of a multitude of individual blocks. In these indicator areas, the maximum line width at a given mask level preferably can range up to 20 $\mu$m and with a maximum pattern factor of 90%. With this preferred arrangement, the wafer may be inspected by identifying blocks that are completely dished out.

Additionally, the process may be automated for mass production. A feedback loop to the polisher can be established, and uniformity data from a polished wafer can be immediately fed back to the polisher in order to adjust process parameters.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
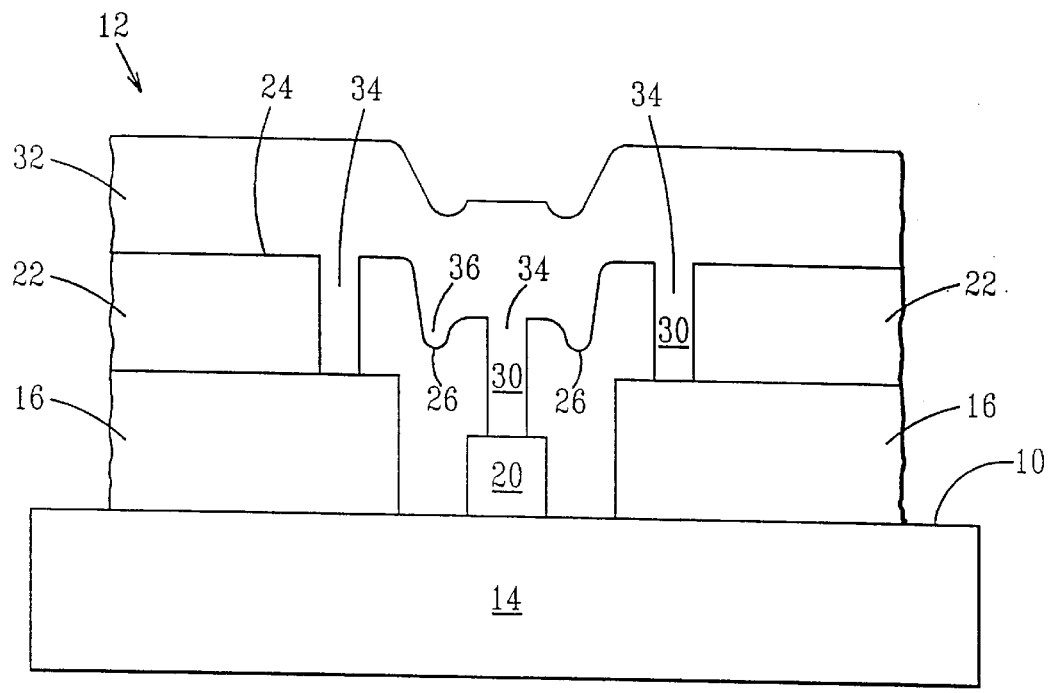
FIG. 1 is a partial schematic cross section view of a wafer that may be used in the practice of the present invention.

FIG. 1 illustrates a wafer 12 before it has been polished by a CMP machine. The wafer 12 may be used in the practice of the invention, but it will be appreciated that this invention is not limited to any specific wafer design or circuit design on a wafer. The wafer 12 has a substrate 14, a number of large devices 16 formed on the substrate, and a small device 20 formed on the substrate between the large devices 16. The large and small devices 16 and 20 are film stacks that form very small electrical components of the integrated circuits on an individual die of the wafer 12. Depending upon the number of layers in each film stack, the top surfaces of the large and small devices 16 and 20 are generally spaced away from the upper surface 10 of the substrate 14 by different axial distances.

A lower layer 22 is deposited over the substrate 14 and the devices 16 and 20 to provide a platform above those devices upon which additional devices may be formed. The lower layer 22 generally follows the topography of the substrate 14 and devices 16 and 20 so that the lower layer 22 has high points 24 positioned over the large devices 16 and depressions 26 positioned between the large and small devices 16 and 20. A number of vias 30 may be etched into the lower layer 22 provide access to the devices 16 and 20. The lower layer 22 is typically made from an insulative material such as BPSG, silicon dioxide, silicon nitride or other known insulative materials.

An upper layer 32 is deposited over the lower layer 22 and into the vias 30 to form interconnects 34 with the device features 16 and 20. The upper layer 32 is made from a conductive material, and generally follows the contour of the lower layer 22 such that the bottom of the upper layer fills the depressions 26 in the lower layer.

The depressions 26 define critical areas 36 on the wafer where the material of the upper layer 32 is typically the last portion of the upper layer that is removed from the wafer by CMP processing. All of the conductive material of the upper layer 32 in the depressions must be removed from the wafer to avoid forming unwanted conductive lines across the top of the wafer 12 that may short one device to another and destroy the operation of the circuit.

Figure 2:
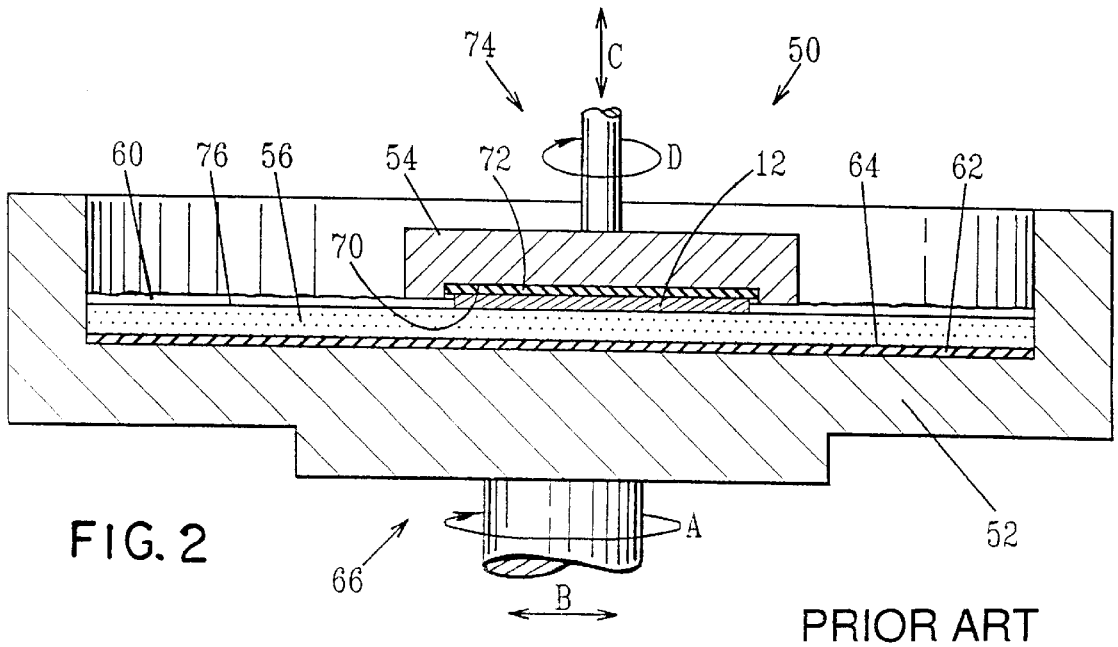
FIG. 2 is a schematic cross section view of a CMP machine that may be used in this invention.

FIG. 2 schematically illustrates CMP machine 50, with a platen 52, a wafer carrier 54, a polishing pad 56, and a slurry 60 on the polishing pad. An underpad 62 is typically attached to the upper surface 64 of the platen, and the polishing pad 56 is positioned on the underpad. In conventional CMP machines, a drive assembly 66 rotates the platen 52 as indicate by arrow A. In other existing CMP machines, the drive assembly 66 reciprocates the platen 52 back and forth as indicated by the arrow B. The motion of the platen 52 is imparted to the pad 56 through the underpad 56 because the polishing pad frictionally engages the underpad. The wafer carrier 54 has a lower surface 70 to which a wafer 12 may be attached, or the wafer 12 may be attached to a resilient pad 72 positioned between the wafer 12 and the lower surface 70. The wafer carrier 54 may be a weighted, free floating wafer carrier, or an actuator assembly 74 may be attached to the wafer carrier to impart axial and rotational motion, as indicated by arrows C and D, respectively.

In the operation of the CMP machine 50, the wafer faces downward against the polishing pad 56, and the platen 52 and the wafer carrier 54 move relative to one another. As the face of the wafer 12 moves across the planarizing surface 76 of the polishing pad 56, the polishing pad and the slurry remove material from the wafer 12. CMP processes typically remove either conductive materials or insulative materials from the surface of the wafer to produce a flat, uniform surface upon which additional layers of devices may be fabricated.

In accordance with the present invention, wafer 12 is provided with a macroblock (macro) formed of blocks of parallel metal lines with varying line widths and pattern factors. Macros of this general kind are known and have been used to investigate CMP processes. With this invention, the used combinations of line widths and pattern factors are chosen to violate existing groundrules in such a way that they will be dished out using the standard consumable set (pad/slurry) of a given metal CMP process. For example, the maximum line width at a given mask level is 10 μm and the maximum pattern factor is 90%.

Figure 3:
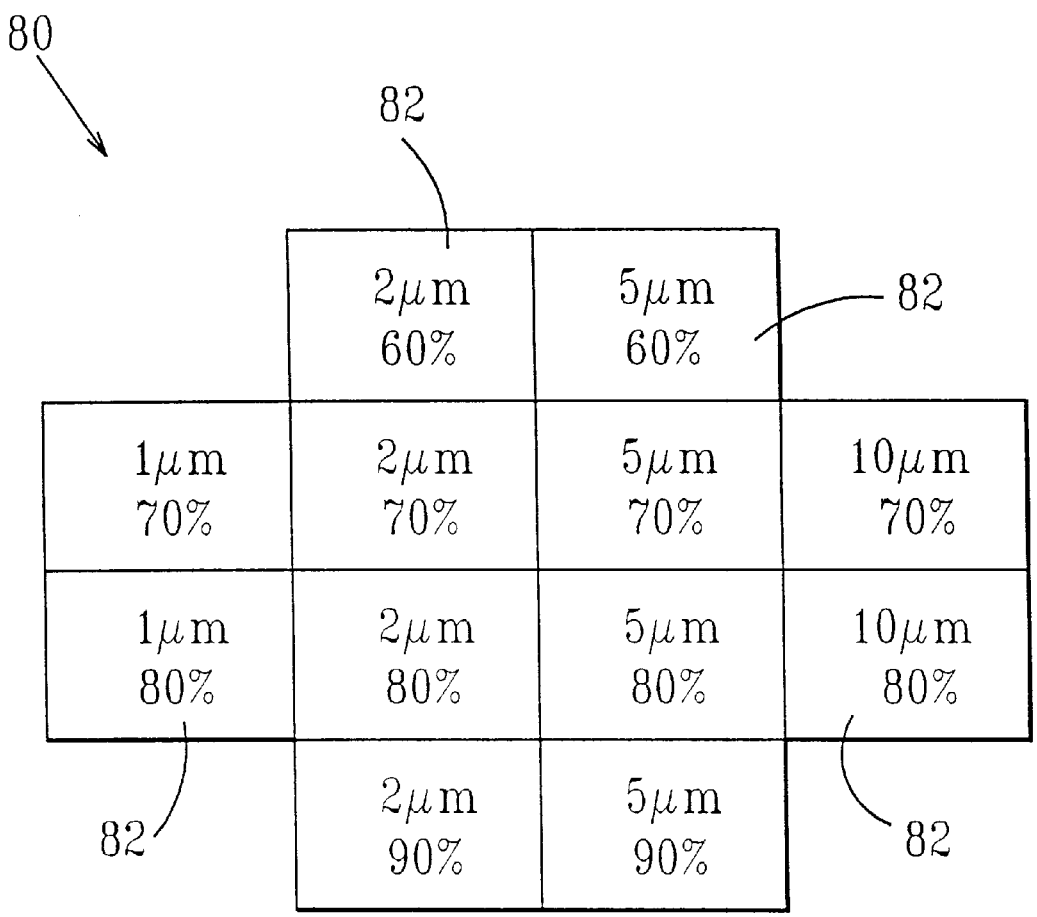
FIG. 3 shows a macroblock that may be used as an indicator area on a wafer. Here a partial of parallel lines is used within each block. The first number in each block indicates the width of the lines, the second than pattern factor.

FIG. 3 shows a specific embodiment of one suitable macro 80. The size of each block 82 in the macro 80 is on the order of 100 μm×100 μm. At this size, the individual blocks can easily be viewed at low (×5) magnifications with any standard optical microscope. It should be noted that only the blocks in bold, i.e. the upper left quadrant of the structure 80, do not violate the groundrules of the desired metal features in the process according to this invention. As a consequence, when polishing to the desired endpoint, only lines in those blocks (within the ground rules) will have the target metal thickness while the other blocks will dish out to some degree, i.e., the metal in them might be completely removed, so that the liner underneath (which is typically used in semiconductor metallization applications, e.g. TiN) is exposed. The color of this liner is markedly different and easily distinguishable from the highly reflective color of the metal lines. In more severe cases—for instance when the wafer is considerably overpolished—the liner will also be removed and the underlying oxide will be exposed. This will further enhance the contrast of the evolving pattern.

Figure 4:
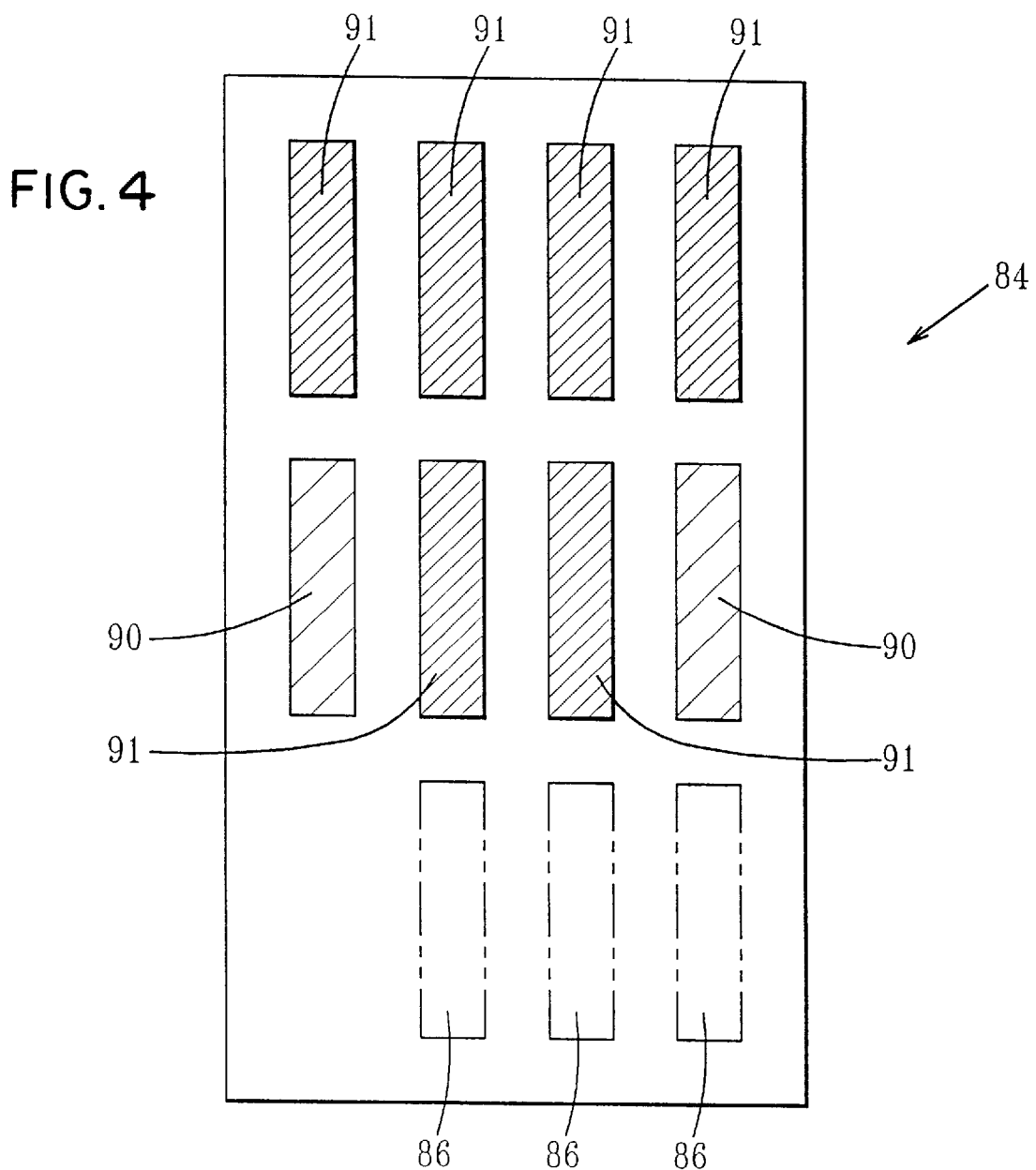
FIG. 4 shows a plan view by optical microscope of an alternate macroblock that may also be used to monitor the polishing of a wafer.

As an example, FIG. 4 shows a similar macro 84 currently used. Completely dished blocks 86 and blocks 90 which were partly dished down to the liner can easily be recognized. Completely dished blocks 86 (which were almost entirely polished down to the liner) can easily be distinguished from partly dished blocks 90 (where removal of the conductor exposed some of the lines) as well as from blocks 91 where dishing has not yet exposed any liner. The pattern in FIG. 4 gives an example for a polishing process where the desired amount of material has been removed.

In this case, this desired amount of polishing leads to a characteristic combination of 6 blocks 91 with no liner exposed, 2 blocks 90 partly dished and 3 blocks 86 completely dished. In case of overpolishing, the ratio of blocks in these three polishing states (undished, partly dished, completely dished) would change in favor of more partly or completely dished blocks. Thus, some or all of the blocks previously labeled 90 might become completely dished out while some or all blocks previously labeled 91 might start to show exposure of liner. Consequently, there would be less than 6 blocks 91, more than 2 blocks 90 and more than 3 blocks 86.

Conversely, in the case of underpolishing, at least some of the blocks previously labeled 90 would not have exposed liner yet. Consequently, there would be more than 6 blocks 91, and less blocks 90 and 86, depending on the exact amount of material removal already completed at that point.

Thus, by mere counting of blocks with a certain reflectivity within the inspection macro, a relatively accurate estimate of the remaining material thickness on the structures as allowed by the ground rules can be made. The inspection is instantaneous, whereas a profiler measurement take on the order of 30 seconds. For process control purposes, an operator of the CMP polishing machine could fill out a form with a table that corresponds to the individual blocks. Blocks that are dished out would simply be checked off in the corresponding table cell.

In an alternative embodiment, a tool with optical pattern recognition is aligned to the macro and used to measure the contrast level of individual blocks. For instance, a simple process control parameter that could be chosen would be the number of blocks in the macro that survive the polish without being dished. Measuring this parameter for a number of chips on the wafer immediately translates into information about the uniformity of the polishing process.

Figure 5:
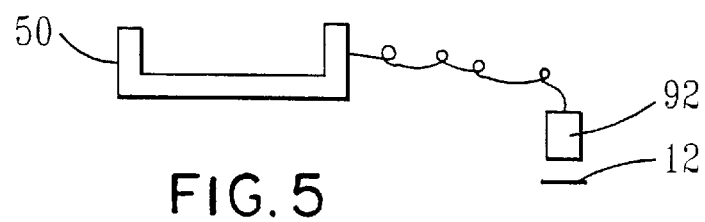
FIG. 5 shows a schematic representation of a feedback circuit between an optical sensor and a polisher.

Another key point of this approach is that this information can be gained directly after polishing, when the wafer is still wet, i.e., before brush cleaning. As schematically represented in FIG. 5, the information regarding the optical appearance of the macro blocks on wafer 12 can be read by sensor 92 and fed back to the polisher 50 (e.g. as one or more electrical signals to a controller for the polisher) immediately in order to adjust polishing parameters. For example back pressure and/or carrier speed could be adjusted in order to correct for center or edge heavy polishing behavior.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

What is claimed is:

1. A method of polishing conductive, insulating or semi-insulating layers on a wafer having metal lines, comprising the steps of:

providing indicator areas on said wafer, said indicator areas having combinations of line widths and pattern factors violating existing ground rules of said metal lines thereby said indicator areas being dished out during said polishing;

using a chemical-mechanical polisher to polish said conductive, insulating or semi-insulating layers and said indicator areas to remove material therefrom;

interrupting said polishing step;

inspecting said indicator areas on the wafer to determine an amount of material removed from said areas;

adjusting the operation of the chemical-mechanical polisher in response to the inspection of the indicator areas; and, if needed, continuing polishing of the wafer.

2. A method according to claim 1, wherein the adjusting step includes the step of adjusting a parameter of the operation of the chemical-mechanical polisher, the parameter selected from the group consisting of a pressure between the polisher and the wafer, and a speed of the polisher.

3. A method according to claim 1, wherein the indicator areas have a multitude of blocks, and the inspecting step includes the step of identifying blocks that are completely dished out.

4. A method according to claim 1, wherein the inspecting step includes the step of using a sensor to inspect the indicator areas and to generate a signal representing the inspection, and the adjusting step includes the step of transmitting said signal to the chemical-mechanical polisher and using said signal to adjust the chemical-mechanical polisher.

5. A method according to claim 1, wherein, in the indicator areas, the maximum line width at a given mask level is 10 $\mu$m and the maximum pattern factor is 90%.

6. A method according to claim 1, wherein the indicator areas include metal features which are macroblocks comprised of a multitude of individual blocks.

7. A method according to claim 6, wherein the size of each block in the macroblock is on the order of 100 $\mu$m×100 $\mu$m.

* * * * *